United States Patent
Maalouf et al.

(10) Patent No.: US 11,990,384 B2
(45) Date of Patent: May 21, 2024

(54) AMPLIFIER MODULES WITH POWER TRANSISTOR DIE AND PERIPHERAL GROUND CONNECTIONS

(71) Applicant: NXP USA, Inc., Austin, TX (US)

(72) Inventors: Elie A. Maalouf, Mesa, AZ (US); Eduard Jan Pabst, Mesa, AZ (US)

(*) Notice: Subject to any disclaimer, the term of this patent is extended or adjusted under 35 U.S.C. 154(b) by 445 days.

(21) Appl. No.: 16/852,064

(22) Filed: Apr. 17, 2020

(65) Prior Publication Data

US 2021/0328551 A1    Oct. 21, 2021

(51) Int. Cl.
*H01L 23/31* (2006.01)
*H01L 21/56* (2006.01)
(Continued)

(52) U.S. Cl.
CPC .......... *H01L 23/3121* (2013.01); *H01L 21/56* (2013.01); *H01L 23/3675* (2013.01); *H01L 23/3736* (2013.01); *H01L 23/481* (2013.01); *H01L 23/528* (2013.01); *H01L 23/5383* (2013.01); *H01L 23/5386* (2013.01); *H01L 23/66* (2013.01); *H01L 24/16* (2013.01); *H01L 24/81* (2013.01); *H01L 25/072* (2013.01); *H03F 1/0288* (2013.01); *H03F 1/301* (2013.01); *H03F 3/21* (2013.01); *H01L 2223/6616* (2013.01);
(Continued)

(58) Field of Classification Search
CPC .............. H01L 23/528; H01L 23/5286; H01L 23/3736; H01L 23/3121; H01L 2223/6644; H01L 23/36
See application file for complete search history.

(56) References Cited

U.S. PATENT DOCUMENTS 5,880,524 A    3/1999    Xie
6,366,486 B1    4/2002    Chen et al.
(Continued)

FOREIGN PATENT DOCUMENTS

GB    2574160 A8    11/2019

OTHER PUBLICATIONS

U.S. Appl. No. 16/851,895 Non Final Office Action issued Jul. 20, 2022—9 pages.
(Continued)

*Primary Examiner* — Dale E Page
*Assistant Examiner* — Abbigale A Boyle
(74) *Attorney, Agent, or Firm* — Sherry Gourlay

(57) ABSTRACT

A power amplifier module includes a module substrate, a power transistor die, and a heat spreader. The module substrate has first, second, and third module pads exposed at a mounting surface. The power transistor die has an input/output surface that faces the mounting surface, an opposed ground surface, an input pad electrically coupled to the first module pad, an output pad electrically coupled to the second module pad, and an integrated power transistor. In an embodiment, the power transistor is a field effect transistor with a gate terminal coupled to the input pad, a drain terminal coupled to the output pad, and a source terminal coupled to the ground surface. The heat spreader has a thermal contact surface that is physically and electrically coupled to the ground surface of the power transistor die. An electrical ground contact structure is connected between the thermal contact surface and the third module pad.

13 Claims, 9 Drawing Sheets

(51) Int. Cl.
  *H01L 23/00* (2006.01)
  *H01L 23/367* (2006.01)
  *H01L 23/373* (2006.01)
  *H01L 23/48* (2006.01)
  *H01L 23/528* (2006.01)
  *H01L 23/538* (2006.01)
  *H01L 23/66* (2006.01)
  *H01L 25/07* (2006.01)
  *H03F 1/02* (2006.01)
  *H03F 1/30* (2006.01)
  *H03F 3/21* (2006.01)

(52) U.S. Cl.
  CPC ............... *H01L 2223/6644* (2013.01); *H01L 2224/16227* (2013.01); *H01L 2224/8112* (2013.01); *H01L 2224/81815* (2013.01); *H03F 2200/451* (2013.01)

(56) References Cited

U.S. PATENT DOCUMENTS

| | | | |
|---|---|---|---|
| 7,052,482 B2 | 5/2006 | Cho | |
| 7,132,744 B2 | 11/2006 | Zho et al. | |
| 7,259,448 B2 | 8/2007 | Zhang et al. | |
| 7,259,457 B2 | 8/2007 | Zhang et al. | |
| 7,799,614 B2 * | 9/2010 | Otremba | H01L 24/82 361/767 |
| 7,892,882 B2 | 2/2011 | Leal et al. | |
| 8,507,320 B2 * | 8/2013 | Otremba | H01L 23/36 257/774 |
| 8,513,062 B2 * | 8/2013 | Nikitin | H01L 24/97 438/119 |
| 9,190,970 B2 * | 11/2015 | Cuoco | H01L 23/66 |
| 9,269,648 B2 | 2/2016 | Higgins, III | |
| 9,468,087 B1 | 10/2016 | Joshi | |
| 9,509,251 B2 * | 11/2016 | Jones | H01L 23/49575 |
| 9,673,162 B2 | 6/2017 | Viswanathan et al. | |
| 9,899,292 B2 | 2/2018 | Chiu et al. | |
| 9,986,646 B2 | 5/2018 | Viswanathan | |
| 10,440,813 B1 | 10/2019 | Li et al. | |
| 11,114,363 B2 | 9/2021 | Nair et al. | |
| 11,557,545 B2 * | 1/2023 | Ketterson | H01L 23/367 |
| 2007/0045822 A1 | 3/2007 | Diaz et al. | |
| 2010/0029045 A1 | 2/2010 | Ramanathan et al. | |
| 2010/0109052 A1 | 5/2010 | Nakajima et al. | |
| 2011/0095403 A1 * | 4/2011 | Lee | H01L 21/4857 257/E23.114 |
| 2011/0127675 A1 * | 6/2011 | Ewe | H01L 25/0655 257/773 |
| 2014/0110788 A1 * | 4/2014 | Cho | H01L 29/66666 257/368 |
| 2015/0255380 A1 * | 9/2015 | Chen | H01L 23/367 361/707 |
| 2016/0126905 A1 | 5/2016 | Zhao et al. | |
| 2017/0117204 A1 | 4/2017 | McPartlin et al. | |
| 2017/0117853 A1 | 4/2017 | McPartlin et al. | |
| 2017/0117857 A1 | 4/2017 | McPartlin et al. | |
| 2017/0317002 A1 | 11/2017 | Kitahara et al. | |
| 2018/0034421 A1 | 2/2018 | Abdo et al. | |
| 2018/0090475 A1 * | 3/2018 | Zuo | H03H 7/0115 |
| 2019/0057924 A1 | 2/2019 | Kim et al. | |
| 2019/0173195 A1 | 6/2019 | Kim et al. | |
| 2019/0305205 A1 | 10/2019 | Feichtinger | |
| 2020/0309582 A1 | 10/2020 | Halimi | |

OTHER PUBLICATIONS

U.S. Appl. No. 16/851,895 Final Office Action issued Nov. 21, 2022—17 pages.
U.S. Appl. No. 16/851,895 Final Office Action issued Jun. 22, 2023—13 pages.
Soga, et al; "Thermal Management for Flip-Chip High Power Amplifiers Utilizing Carbon Nanotube Bumps"; IEEE International Symposium on Radio-Frequency Integration Technology; 4 pages (2009).
Yuen, Cindy et al; Ä Compact Flip Chip High Power Amplifier Module for Mobile Applications; Proceedings of Asia Pacific Microwave Conference 4 pages (Dec. 7, 2010).
U.S. Appl. No. 16/851,895 Notice of Allowance issued Feb. 8, 2024—10 pages.

* cited by examiner

AMPLIFIER MODULES WITH POWER TRANSISTOR DIE AND PERIPHERAL GROUND CONNECTIONS

TECHNICAL FIELD

Embodiments of the subject matter described herein relate generally to amplifier modules, and more particularly to amplifier modules that include power transistor dies.

BACKGROUND

Wireless communication systems employ power amplifier modules for increasing the power of radio frequency (RF) signals. A power amplifier module includes a module substrate and amplifier circuitry coupled to a mounting surface of the module substrate. A typical module substrate may include an input terminal, an output terminal, conductive signal routing structures, bondpads at the mounting surface, and one or more ground/thermal dissipation structures extending through the module substrate. The amplifier circuitry often includes a power transistor die, which has at least one integrated power transistor, top-side input/output (I/O) bondpads, and a bottom-side conductive ground layer. The bottom-side, conductive ground layer of the power transistor die is directly connected to the ground/thermal dissipation structure(s) of the module substrate.

To convey RF signals between the module substrate and the power transistor die, electrical connections are made using bondwires that extend between bondpads at the mounting surface of the module substrate and the top-side I/O bondpads of the power transistor die. When the integrated power transistor is a field effect transistor (FET), the die's input bondpad connects to the gate terminal of the FET, and the die's output bondpad connects to the drain terminal of the FET. The source terminal of the FET is coupled through the die to the bottom-side, conductive ground layer, which in turn is connected to the ground/thermal dissipation structure(s), as mentioned above. During operation, the power transistor amplifies input RF signals received through the transistor die input bondpad, and conveys the amplified RF signal to the transistor die output bondpad. All the while, heat generated by the power transistor die is dissipated through the ground/thermal dissipation structure(s) embedded in the module substrate. Although the conventional module designs are well-suited to many applications, amplifier module designers continuously strive to optimize amplifier module designs to reduce module size, improve thermal dissipation, and optimize performance for current and new applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
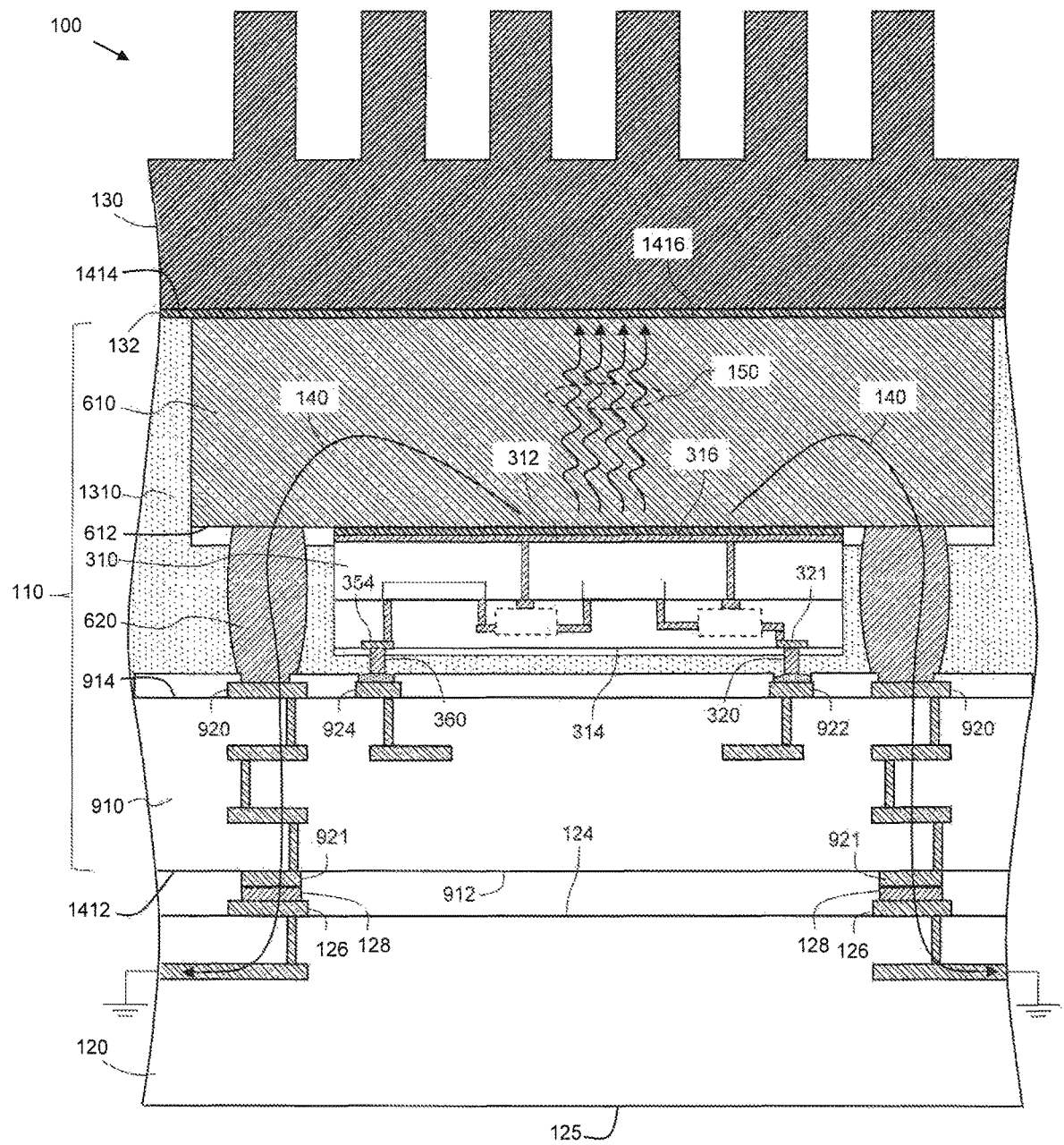
FIG. 1 is a cross-sectional, side view of a radio frequency (RF) system that includes a power amplifier module, in accordance with an example embodiment.

FIG. 1 is a cross-sectional, side view of a radio frequency (RF) system 100 that includes a power amplifier module 110, in accordance with an example embodiment. The RF system 100 generally includes a system substrate 120, the power amplifier module 110, and a heat dissipation structure 130. According to an embodiment, the system substrate 120 includes a multi-layer printed circuit board (PCB) with a mounting surface 124, an opposed bottom surface 125, and one or more patterned conductive layers separated by dielectric material. In the example embodiment depicted in FIG. 1, a conductive layer on the mounting surface 124 is patterned to define a plurality of conductive pads, including pads 126, which provide for electrical connectivity between the system substrate 120 and electrical components (e.g., module 110) coupled to the mounting surface 124. Some of the pads at the mounting surface 124 of the system substrate 120 may be used to convey RF signals between the power amplifier module 110 and other components mounted on or connected to the system substrate 120, while other pads at the mounting surface 124 may be used to provide connectivity to system ground or other voltage references (e.g., bias voltages). For example, in FIG. 1, pads 126 each provide for connectivity to system ground.

The power amplifier module 110 is physically and electrically coupled to the mounting surface 124 of the system substrate 120. As will be described in more detail later, the power amplifier module 110 has a contact surface 1412, an opposed heat dissipation surface 1414, a power transistor die 310, a heat spreader 610, and a module substrate 910. The module substrate 910, the power transistor die 310, and the heat spreader 610 are held in a fixed spatial relationship to each other with encapsulant material 1310.

According to an embodiment, the module substrate 910 includes a small, multi-layer PCB with a mounting surface 914, an opposed bottom surface 912, and multiple patterned conductive layers separated by dielectric material. In the example embodiment depicted in FIG. 1, a conductive layer on the mounting surface 914 is patterned to define a plurality of conductive pads, including pads 920, 922, 924, that are exposed at the mounting surface 914. Pads 920, 922, 924 provide for electrical connectivity between the module substrate 910, the power transistor die 310, and the heat spreader 610, as will be explained in more detail below. Some of the pads at the mounting surface 914 of the module substrate 910 may be used to convey RF signals, while other pads at the mounting surface 914 may be used to provide connectivity to system ground or other voltage references (e.g., bias voltages). For example, in FIG. 1, pads 920 each provide for connectivity to system ground. More specifically, each of pads 920 are electrically coupled through conductive vias and intermediate patterned conductive layers to additional pads 921 at the bottom surface 912 of the module substrate 910, and those additional pads 921 are coupled to corresponding ground pads 126 of the system substrate 120, as discussed above.

In contrast, pads 922, 924 at the mounting surface 914 of the module substrate 910 are configured to convey input and output RF signals, respectively, between the module substrate 910 and the power transistor die 310. Although not illustrated in FIG. 1, but as will be discussed in more detail in conjunction with FIG. 11, later, pads 922, 924 are electrically coupled to other power amplifier components (not shown in FIG. 1), which also are coupled to the mounting surface 914 of the module substrate 910.

The power transistor die 310 has an input/output (I/O) surface 314, and a ground surface 312 opposite the I/O surface 314. As will be discussed in more detail later, one or more power transistors are integrally formed in the power transistor die 310. A control terminal of at least one of the transistor(s) is electrically coupled to an input pad 321 exposed at the I/O surface 314, and a first current-carrying terminal (e.g., a drain terminal) of at least one of the transistor(s) is electrically coupled to an output pad 354 exposed at the I/O surface 314. A second current-carrying terminal (e.g., a source terminal) of the transistor(s) is electrically coupled to a conductive layer 316 on the ground surface 312 of the power transistor die 310.

As illustrated in FIG. 1, the power transistor die 310 is coupled to the module substrate 910 with the I/O surface 314 facing the mounting surface 914 of the module substrate 910. Further, the input pad 321 of the power transistor die 310 is electrically coupled through an input contact structure 320 to module pad 922, and the output pad 354 is electrically coupled through an output contact structure 360 to module pad 924.

The heat spreader 610 has an interior thermal contact surface 612 (also referred to as a die contact surface), and an opposed outer thermal contact surface 1416 (also referred to as a heat dissipation structure contact surface). The power transistor die 310, and more particularly the conductive layer 316 on the ground surface 312 of die 310, is physically, thermally, and electrically coupled to an interior area (e.g., area 614, FIG. 6) of the die contact surface 612 of the heat spreader 610. A peripheral area of the die contact surface 612 extends beyond the ground surface 312 of the power transistor die 310, and a plurality of electrical ground contact structures 620 are physically and electrically connected between the peripheral area of the die contact surface 612 and a plurality of module pads 920 at the mounting surface 914 of the module substrate 910. A system heat dissipation structure 130 is physically and thermally coupled to the heat dissipation surface 1414 of the power amplifier module 110, and more specifically to the outer thermal contact surface 1416 of the heat spreader 610.

During operation of RF system 100, input RF signals are provided through the patterned conductive structures of the system substrate 120 to an RF input terminal (e.g., input terminal 1102, FIG. 11) at the contact surface 1412 of the power amplifier module 110. The input RF signals are conveyed through the module substrate 910 (and potentially other amplifier components mounted to substrate 910, such as power splitter 1106, FIG. 11) to module pad 922 and the input pad 321 of the power transistor die 310. The input RF signals are then amplified by the power transistor(s) integrated within the power transistor die 310, and the amplified output RF signals are produced at output pad 354, which is electrically coupled to module pad 924. The amplified output RF signals are then conveyed through module substrate 910 (and potentially other amplifier components connected to substrate 910) to an RF output terminal (e.g., output terminal 1104, FIG. 11) at the contact surface 1412 of the power amplifier module 110.

As mentioned previously, a current-carrying terminal (e.g., a source terminal) of each power transistor integrated within the power transistor die 310 is electrically connected to system ground. In the embodiment illustrated in FIG. 1, to establish this ground connection, the above-mentioned current-carrying terminal (e.g., the source terminal) is electrically connected to conductive layer 316 on the ground surface 312 of the power transistor die 310. As indicated by arrows 140, the conductive layer 316, in turn, is electrically connected to system ground through the electrically- and thermally-conductive heat spreader 610, ground contact structures 620, module substrate pads 920, 921, system substrate pads 126, and further conductive structures of the system substrate 120 (which ultimately are electrically connected to system ground, as shown in FIG. 1).

During operation, significant thermal energy (heat) may be produced by the power transistor(s) within the power transistor die 310. As indicated by arrows 150, the thermal energy produced by the power transistor(s) is conveyed through the heat spreader 610 to the heat dissipation structure 130, which effectively dissipates the heat to the ambient atmosphere. Accordingly, the heat spreader 610 provides two functions: 1) the function of conveying heat produced by the power transistor die 310 to the heat dissipation structure 130; and 2) the function of electrically coupling the integrated power transistor(s) within the power transistor die 310 to system ground.

Figure 2:
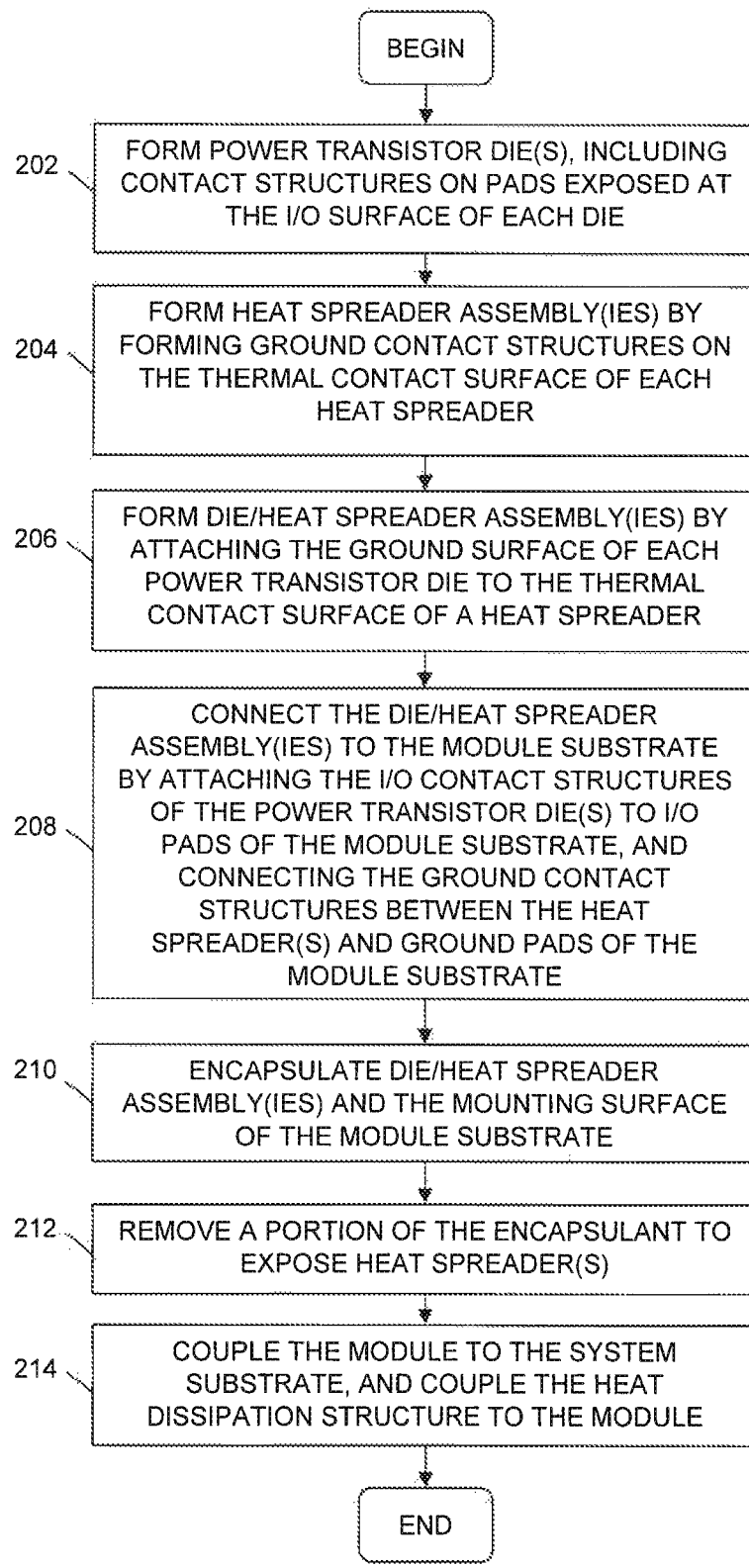
FIG. 2 is a flowchart of a method of fabricating a power amplifier module and assembling the power amplifier module into an RF system, in accordance with an example embodiment.
Figure 3:
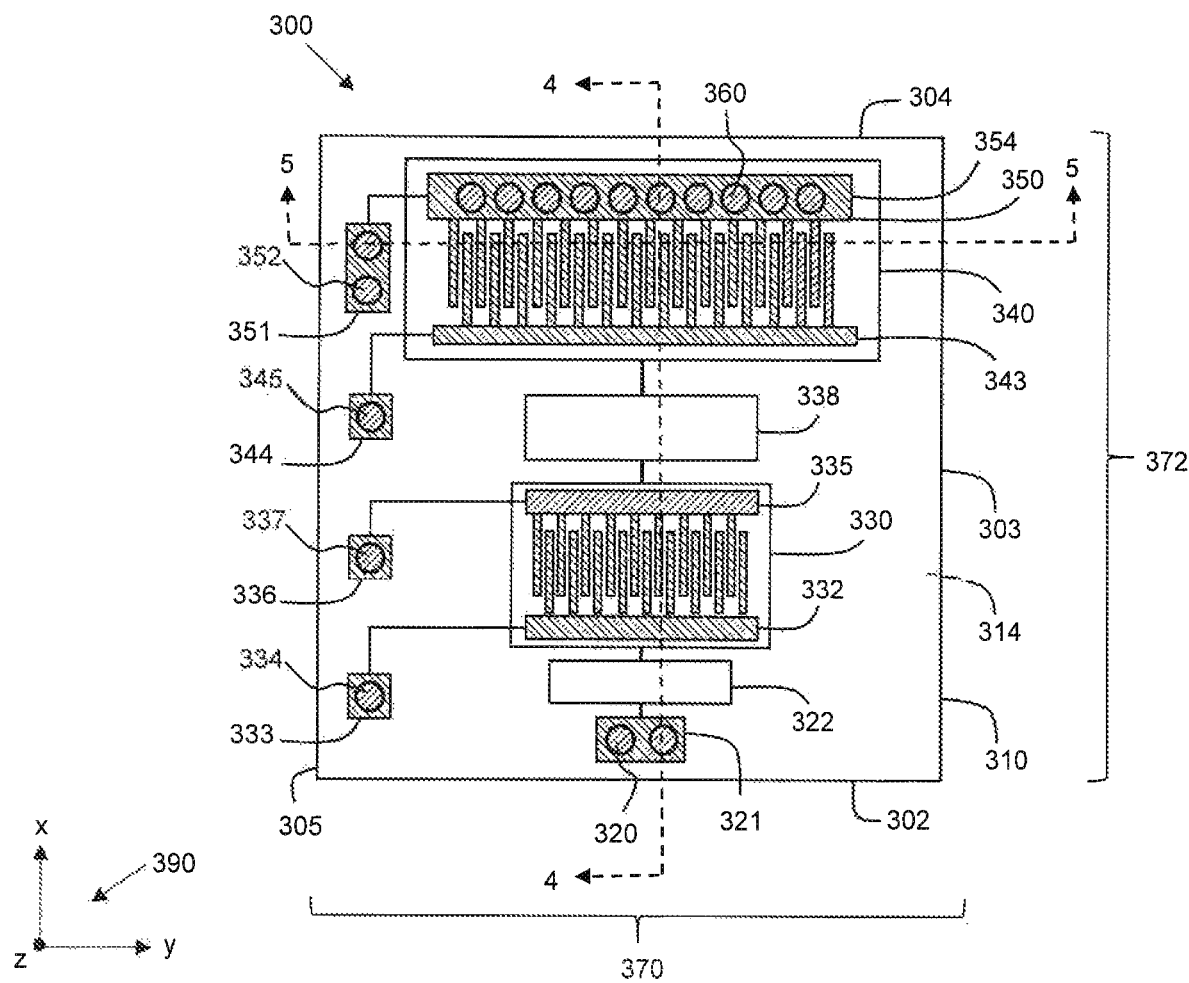
FIG. 3 is a top view of a power transistor die, in accordance with an example embodiment.

FIG. 2 is a flowchart of a method of fabricating a power amplifier module (e.g., power amplifier module 110, FIG. 1) and assembling the power amplifier module into an RF system (e.g., RF system 100, FIG. 1), in accordance with an example embodiment. The method may begin, in blocks 202 and 204, which may be performed in either order or concurrently. Referring first to block 202, one or more power transistor dies are provided, and contact structures are formed on pads exposed at the I/O surface of the die(s). To illustrate, FIG. 3 is a top view of a power transistor die assembly 300 that includes a power transistor die 310 with contact structures 320, 334, 337, 345, 352, 360 formed on die pads 321, 333, 336, 344, 351, 354, respectively, in accordance with an example embodiment. To enhance understanding, FIG. 3 should be viewed simultaneously with FIGS. 4 and 5, which are cross-sectional, side views of the power transistor die 310 of FIG. 3 along lines 4-4 and 5-5, respectively, in accordance with an example embodiment. Coordinate axes 390 are provided in FIGS. 3-5 to clarify the orientation of each of the views. As used herein, the terms "die," "integrated circuit die," and "IC die" mean a single, distinct semiconductor die (or semiconductor substrate) within which one or more circuit components (e.g., transistors, passive devices, and so on) are integrally-formed and/or directly physically connected to produce a monolithic structure.

Figure 4:
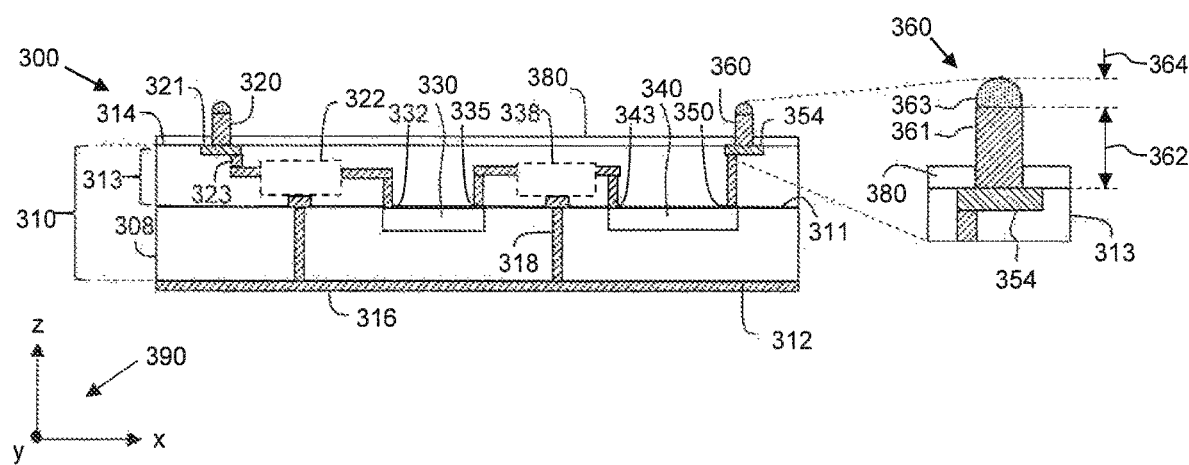
FIG. 4 is a cross-sectional, side view of the power transistor die of FIG. 3 along line 4-4, in accordance with an example embodiment.
Figure 5:
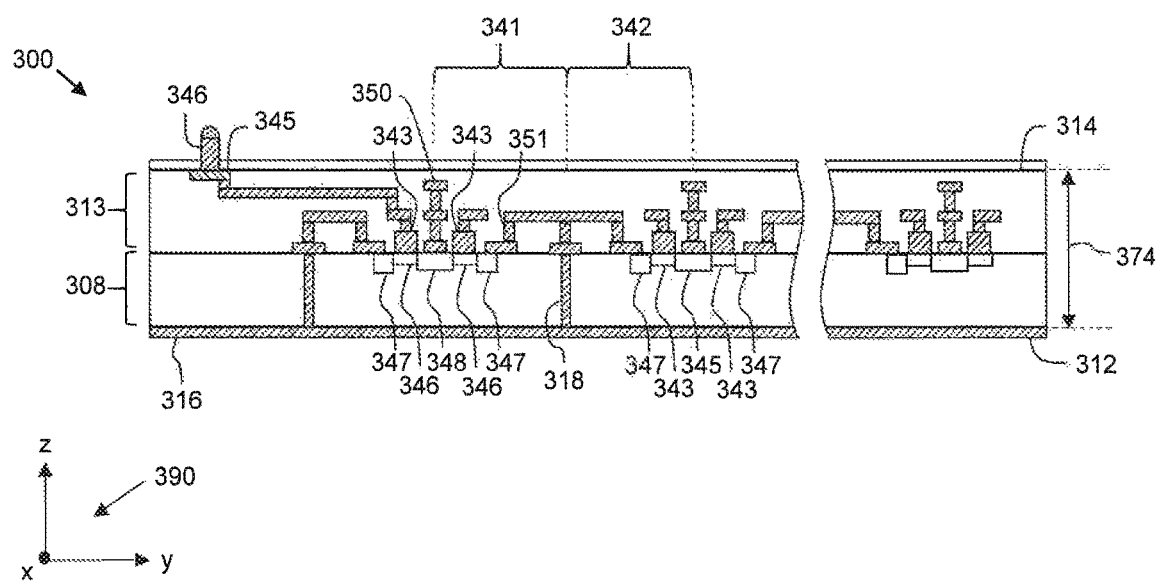
FIG. 5 is a cross-sectional, side view of the power transistor die of FIG. 3 along line 5-5, in accordance with an example embodiment.

Power transistor die 310 may be formed with a plurality of other identical or different dies in a single semiconductor wafer. The power transistor die 310 in FIGS. 3-5 is shown as a singulated unit, but those of skill in the art would understand that blocks 202 and 206 may be performed simultaneously for a plurality of dies prior to singulation of those dies from a wafer in which they were originally formed. Either way, at some point prior to block 208, power transistor die 310 would be singulated from the wafer in which it was originally formed.

Power transistor die 310 includes a two-stage amplifier integrally formed in a single IC die. The die 310 has a substantially rectangular periphery defined by opposed input and output sides 302, 304 (e.g., bottom and top sides in the orientation of FIG. 3) and opposed left and right sides 303, 304 that extend between the input and output sides. In the specific embodiment illustrated in FIG. 3, power transistor die 310 includes the following circuitry integrally- and monolithically-formed in and on semiconductor die 310: an input pad 321, an input impedance matching network 322, a two-stage amplifier that includes a pre-amplifier transistor 330 and a final-stage amplifier transistor 340, an inter-stage impedance matching network 338, an output pad 354, and bias voltage pads 333, 336, 344, 351. Essentially, the pre-amplifier FET 330 and the final-stage amplifier FET 340 are coupled in series between the input pad 321 and the output pad 354. The pre-amplifier FET 330 may be configured to apply a gain to a respective input RF signal in a range of about 15 decibels (dB). The final-stage amplifier FET 340 is significantly larger than the pre-amplifier FET 330 (e.g., at least twice as large to apply at least twice the gain), and may be configured to apply a gain to a respective input RF signal in a range of about 15 dB to about 25 dB.

As seen most clearly in FIG. 4, the power transistor die 310 includes a base semiconductor substrate 308 and a plurality of build-up layers 313 over a top surface 311 of the base semiconductor substrate 308. In a particular example embodiment, the base semiconductor substrate 308 is a high-resistivity silicon substrate (e.g., a silicon substrate having bulk resistivity in a range of about 1000 ohm/centimeter (cm) to about 100,000 ohm/cm or greater). Alternatively, the base semiconductor substrate 308 may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate 308 may be any of multiple variants of a GaN substrate or other III-V semiconductor substrates.

The plurality of build-up layers 313 may include, for example, a plurality of interleaved dielectric layers, patterned conductive layers, and other conductive structures (e.g., conductive polysilicon structures). The top surface of the build-up layers 313 corresponds to the top surface 314 of the die 310. In the build-up layers 312, portions of different patterned conductive layers and structures are electrically coupled with conductive vias (e.g., via 323). Further, conductive through substrate vias (TSVs) (e.g., TSV 318) may provide conductive paths between the top and bottom surfaces 311, 312 of the base semiconductor substrate 308. The TSVs may or may not be lined with dielectric material to insulate the TSVs from the base semiconductor substrate 308. According to an embodiment, a conductive layer 316 on the bottom surface 312 of the base semiconductor substrate 308 (corresponding to the bottom surface 312 of the die 310) functions as a ground node for the power transistor die 310. According to an embodiment, a height 374 of the power transistor die 310 is in a range of about 75 microns to about 100 microns, although die 310 may be thinner or thicker, as well.

As mentioned above, the die 310 includes a series arrangement of two power transistors, including a relatively low-power pre-amplifier transistor 330 and a relatively high-power final-stage amplifier transistor 340. For example, each of the transistors 330, 340 may be field effect transistors (FETs), such as laterally-diffused metal oxide semiconductor (LDMOS) FETs or high electron mobility transistors (HEMTs). The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 330, 340 includes a gate terminal 332, 343 (or control terminal), a drain terminal 335, 350 (or first current-carrying terminal), and a source terminal (or second current-carrying terminal), not numbered. In a specific embodiment, each transistor 330, 340 is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate 308. Due to their elongated shapes, each set of adjacent drain and source regions, along with an associated gate structure, may be referred to as a "transistor finger," and each transistor 330, 340 includes a plurality of parallel transistor fingers within the active area of the transistor (indicated with vertical lines in FIG. 3).

A variably-conductive channel (and, in some embodiments, a drain drift region) is present between adjacent source and drain regions. Conductive (e.g., polysilicon or metal) gate structures formed over the base semiconductor substrate 308 are coupled to and extend from each gate terminal 332, 343 over and along the channel regions. Similarly, additional conductive (e.g., polysilicon) drain structures formed over the base semiconductor substrate 308 are coupled to and extend from each drain terminal 335, 350 over and along the drain regions. The source regions are electrically coupled to conductive (e.g., polysilicon or metal) source contacts, which in turn are coupled to conductive TSVs (e.g., TSV 318, FIGS. 4, 5) that extend through the base semiconductor substrate 308 to connect with conductive layer 316 on the bottom surface of the base semiconductor substrate 308. Voltages applied to the gate terminals 332, 343 during operation modulate the conductivity of the variably-conductive channels, thus enabling current flow between source and drain regions (or ultimately between conductive layer 316 and each drain terminal 335, 350).

The input pad 321 is coupled through an input impedance matching network 322 to an input terminal (e.g., gate terminal 332) of pre-amplifier FET 330, an output (e.g., drain terminal 335) of the pre-amplifier FET 330 is electrically coupled through an inter-stage impedance matching network 338 to an input terminal (e.g., gate terminal 343) of final-stage amplifier FET 340. The output terminal (e.g., drain terminal 350 of final-stage amplifier FET 340 is electrically coupled to the output pad 354. An output impedance matching network (not shown) may be coupled between the drain terminal 350 of the final-stage amplifier FET 340 and the output pad 354, in some embodiments. The source terminals of each of FETs 330, 340 are electrically coupled to a ground reference (e.g., using TSVs 318 through the base semiconductor substrate 308 to a bottom conductive layer 316, FIGS. 4, 5). As is most clearly illustrated in FIG. 5, adjacent transistor fingers (e.g., fingers 341 and 342) may be arranged in a mirrored configuration with a shared drain terminal 350.

According to an embodiment, gate bias voltages for each of the FETs 330, 340 are provided through gate bias pads 333, 344, respectively, and drain bias voltages for each of the FETs 330, 340 are provided through drain bias pads 336, 351, respectively. In some embodiments, integrated bias circuitry may be included between the bias pads 333, 336, 344, 351 and the respective gates 332, 343 and drains 335, 350 of the FETs 330, 340. In other embodiments, fewer bias pads 333, 336, 344, 351 may be included, and the integrated bias circuitry may include resistor divider networks configured to provide appropriate bias voltages to the various gates 332, 343 and drain terminals 335, 350 from the fewer number of bias contact pads. As will be discussed later in conjunction with FIGS. 11 and 12, two instances of the transistor die 310 may be incorporated in a multiple-die amplifier system, such as a Doherty amplifier, to function as a main amplifier and a peaking amplifier. In such an embodiment, to ensure proper operation of the Doherty amplifier, a first transistor die (e.g., a first instance of die 310) used as the main amplifier is biased to operate in class AB mode, and a second transistor die (e.g., a second instance of die 310) used as the peaking amplifier may be biased to operate in class C mode.

According to an embodiment, one or more contact structures 320, 334, 337, 345, 352, 360 are formed on or attached to each of pads 321, 333, 336, 344, 351, 354. As shown most clearly in the enlarged view of contact structure 360 in FIG. 4, each contact structure 320, 334, 337, 345, 352, 360 includes a rigid conductive pillar 361, with a proximal end directly connected to a respective pad (e.g., pad 354), and a distal end at a height 362 above the surface of the pad to which the pillar 361 is connected. The height 362 essentially defines a standoff between the I/O surface 314 of the die 310 and a die-facing surface of a module substrate (e.g., surface 914 of module substrate 910, FIG. 9) to which the die 310 later will be attached. For example, the height 362 may be in a range of about 50 microns to about 100 microns (e.g., about 75 microns), although the height 362 may be smaller or larger, as well.

According to an embodiment, each pillar 361 is formed from a highly conductive material, such as copper or another suitable conductive metal. For example, a mask layer 380 may be applied to the I/O surface 314 of the die 310, and the mask layer 380 may then be patterned to include openings that expose the pads 321, 333, 336, 344, 351, 354 where the conductive pillars (e.g., pillar 361) of each of the contact structures 320, 334, 337, 345, 352, 360 are to be formed. The conductive pillars 361 then may be formed directly on each pad 321, 333, 336, 344, 351, 354, such as by plating (e.g., building up the pillar 361 in a series of plating operations). Alternatively, the conductive pillars 361 could be separately formed, and subsequently attached to each pad 321, 333, 336, 344, 351, 354 with conductive adhesive, by sintering or brazing, or using other attachment means.

In the embodiment of FIG. 3, the conductive pillars 361 are cylindrical in shape (i.e., having a circular cross-section), with a diameter in a range of about 60 microns to about 90 microns (e.g., about 75 microns), although the diameter may be smaller or larger, as well. In other embodiments, the conductive pillars may have shapes other than cylindrical shapes, such as bar-shaped, cubic, or other shapes. For example, FIG. 3 shows ten, cylindrically-shaped contact structures 360 coupled to pad 354. In an alternate embodiment, some or all of the cylindrically-shaped contact structures 360 could be replaced with one or more bar-shaped contact structures, of height 362, that extend along the length (along the y-axis) of the pad 354. The cumulative cross-sectional area (in the x-y plane) of the set of contact structures that are connected to any particular pad 321, 333, 336, 344, 351, 354 is selected to ensure that the set of contact structures is capable of handling the current produced at each particular pad 321, 333, 336, 344, 351, 354.

According to an embodiment, a conductive solder ball 363 (e.g., formed from tin-silver or other solder composition), with height 364, is disposed on the distal end of each conductive pillar 361 (i.e., the end of the pillar 361 at height 362 above the pad, which end is opposite the proximal end). For example, the height 364 may be in a range of about 20 microns to about 40 microns (e.g., about 30 microns), although the height 364 may be smaller or larger, as well. As will be described in more detail in conjunction with FIG. 10, the conductive solder balls 363 ultimately will be brought into contact with pads (e.g., pads 922, 924, FIG. 10) of a module substrate (e.g., substrate 910, FIG. 10), and the solder balls 363 will be re-flowed to attach (and electrically connect) the contact structures 320, 334, 337, 345, 352, 360 (and thus the die 310) to the module substrate. Accordingly, after reflowing the solder balls 363 (i.e., heating the solder balls 363 above their melting points, and subsequently allowing them to cool and re-solidify), their height will become significantly smaller, and the total height of the power transistor die assembly 300 can be considered to be equal to the height 374 of the die 310 plus the height 362 of the pillars 361.

Figure 6:
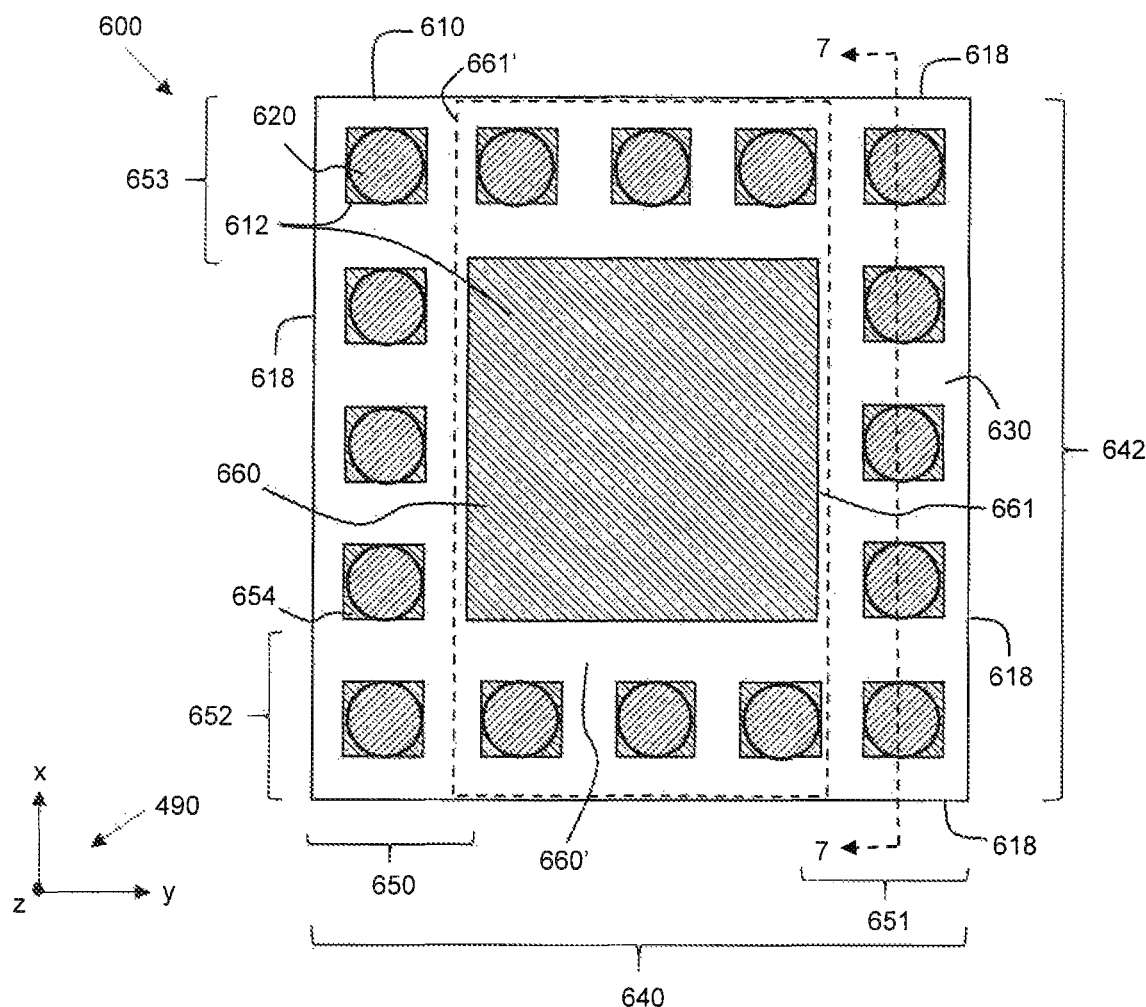
FIG. 6 is a top view of a heat spreader, in accordance with an example embodiment.
Figure 7:
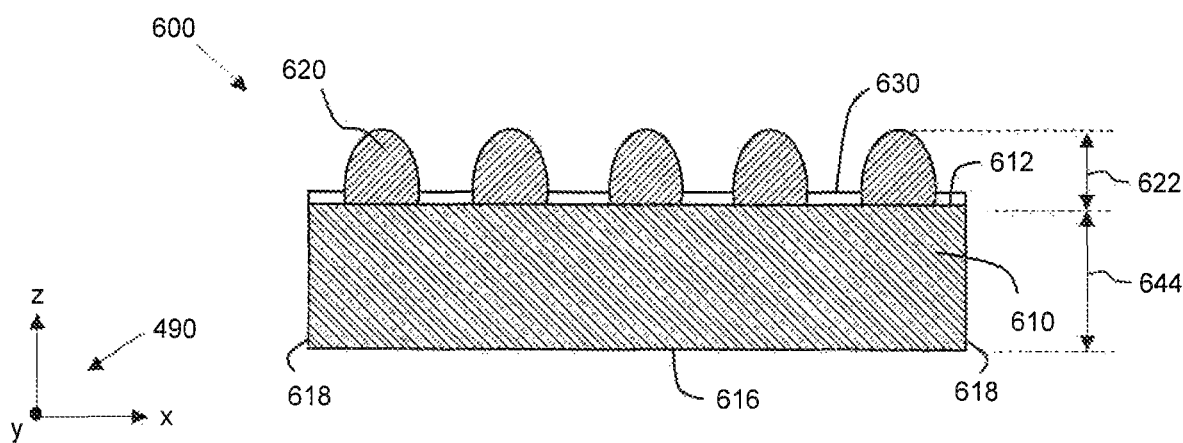
FIG. 7 is a cross-sectional, side view of the heat spreader of FIG. 6 along line 7-7, in accordance with an example embodiment.

Referring again to FIG. 2, block 204 includes forming one or more heat spreader assemblies by providing one or more heat spreaders (e.g., one for each die 310), and forming ground contact structures on a thermal contact surface of each heat spreader. To illustrate, FIG. 6 is a top view of a heat spreader assembly 600, which includes a heat spreader 610 with ground contact structures 620 formed on a thermal contact surface 612 of the heat spreader 610, in accordance with an example embodiment. FIG. 6 should be viewed simultaneously with FIG. 7, which is a cross-sectional, side view of the heat spreader 610 of FIG. 6 along line 7-7, in accordance with an example embodiment. Coordinate axes 490 are provided in FIGS. 6 and 7 to clarify the orientation of each of the views.

According to an embodiment, the heat spreader 610 is formed from a thermally- and electrically-conductive material. For example, the heat spreader 610 may be formed from copper or another bulk conductive material. The heat spreader has a thermal contact surface 612, an opposed surface 616, and sidewalls 618 that extend between surfaces 612, 616. According to an embodiment, a height 644 of the heat spreader 610 is in a range of about 700 microns to about 800 microns, although the height 644 could be smaller or larger, as well.

At least two non-overlapping areas are defined at thermal contact surface 612. These areas include an "interior" area 660 and at least one "peripheral" area 650, 651, 652, 653. As used herein, an "interior" area (e.g., area 660) is defined as a two-dimensional portion of the thermal contact surface 612 that has a perimeter (e.g., perimeter 661) that is at least partially offset from the perimeter (or the sidewalls 618) of the heat spreader 610. In contrast, a "peripheral" area (e.g., areas 650-653) is defined as a two-dimensional portion of the thermal contact surface 612 that has an edge that coincides with the perimeter (or a sidewall 618) of the heat spreader 610. As most clearly shown in FIG. 6, the entire perimeter 661 of interior area 660 is offset from the perimeter of the heat spreader 610, and four peripheral areas 650-653 are located between the perimeter 661 of the interior area 660 and the perimeter (or the sidewalls 618) of the heat spreader 610. In other embodiments, portions of the perimeter 661 of the interior area 660 may coincide with one or more portions of the perimeter of the heat spreader 610, as long as at least one peripheral area 650-653 is located between the perimeter 661 of the interior area 660 and at least one sidewall 618. For example, in FIG. 6, dashed alternative perimeter 661' indicates the footprint of an alternatively-configured interior area 660' that has two edges that coincide with two sidewalls 618 of the heat spreader 610 (and accordingly only two peripheral areas 650, 651 are present between the left and right sides of the interior area 660' and the left and right sidewalls 618).

In any event, the perimeter 661 (or 661') of the interior area 660 is sized to correspond to the perimeter of a die (e.g., die 310) that will be attached to the thermal contact surface 612, as will be described in more detail in conjunction with block 206 and FIG. 8, below. Further, each of the peripheral areas 650 have a width (i.e., the dimension between the perimeter of the interior area and a sidewall 618 of the heat spreader 610) that is sufficient to provide space for ground contact structures 620 to be attached to the heat spreader 610 in each peripheral area 650. Accordingly, in an embodiment, the width 640 and length 642 of the heat spreader 610 are larger than the width and length of the interior area 660. In the alternate embodiment indicated by perimeter 661', the width 640 of the heat spreader 610 is larger than the width of interior area 660', and the length 642 of the interior area 660' and the heat spreader 610 are substantially equal.

According to an embodiment, one or more ground contact structures 620 are connected to the thermal contact surface 610 of the heat spreader 610 in some or all of the peripheral areas 650-653. According to an embodiment, each ground contact structure 620 includes a conductive solder ball (e.g., formed from tin-silver or other solder composition). To connect the ground contact structures 620 to the thermal contact surface 610, a mask layer 630 is applied to the thermal contact surface 612 of the heat spreader 610, and the mask layer 630 is patterned to include openings that expose portions 652 of the thermal contact surface 612 in the peripheral areas 650 where the ground contact structures 620 are to be formed. The mask layer 630 also includes an opening to expose the interior area 660 of the thermal contact surface 612. The ground contact structures 620 are formed directly on the portions 652 of the thermal contact surface 612 that are exposed in the peripheral areas 650.

According to an embodiment, each ground contact structure 620 has a height 622 and mass that ultimately will be sufficient to bridge the distance between the thermal contact surface 612 and a top surface of a module substrate (e.g., module substrate 910, FIG. 9), as will be described in more detail later. According to an embodiment, this distance is substantially equal to the total height of the power transistor die assembly 300 (e.g., a sum of die height 374 and pillar height 362). In an alternate embodiment, the ground contact structures 620 may be formed from rigid conductive pillars (e.g., copper pillars) or other conductive structures that have heights approximately equal to the total height of the power transistor die assembly 300.

Referring again to FIG. 2, block 206 includes forming a die/heat spreader assembly by attaching the ground surface of a power transistor die (e.g., die 310) to the thermal contact surface of a heat spreader (e.g., heat spreader 610). For example, FIG. 8 is a cross-sectional, side view of a die/heat spreader assembly 800, in accordance with an example embodiment. The die/heat spreader assembly 800 includes a power transistor die assembly (e.g., assembly 300, FIGS. 3-5) that is thermally- and electrically-connected to a heat spreader assembly (e.g., heat spreader assembly 600, FIGS. 6, 7). To fabricate the die/heat spreader assembly 800, a power transistor die assembly 300 and a heat spreader assembly 600 (both of which are shown, in FIG. 8, in orientations that are flipped 180 degrees with respect to the orientations in FIGS. 4 and 7, respectively) are connected together. More specifically, the ground surface 312 (and more specifically the conductive layer 316) of the power transistor die assembly 300 is attached to the interior area (e.g., interior area 660, FIG. 6) of the thermal contact surface 612 of the heat spreader assembly 600.

For example, attachment of the power transistor die assembly 300 and the heat spreader assembly 600 may be achieved by dispensing die attach material 810 on the interior area 660 of the thermal contact surface 612 of the heat spreader assembly 600 (and/or on the ground surface 312 of the power transistor die assembly 300), and the ground surface 312 (and/or conductive layer 316) may be brought into contact with the die attach material 810 and the heat spreader assembly 600. For example, the die attach material 810 may include electrically- and thermally-conductive epoxy material, uncured sinter material (e.g., silver sinter paste), solder, or other suitable die-attach materials. The die attach material 810 may then be cured, reflowed, or otherwise processed to achieve a robust mechanical and thermal bond between the heat spreader assembly 600 and the power transistor die assembly 300.

Figure 8:
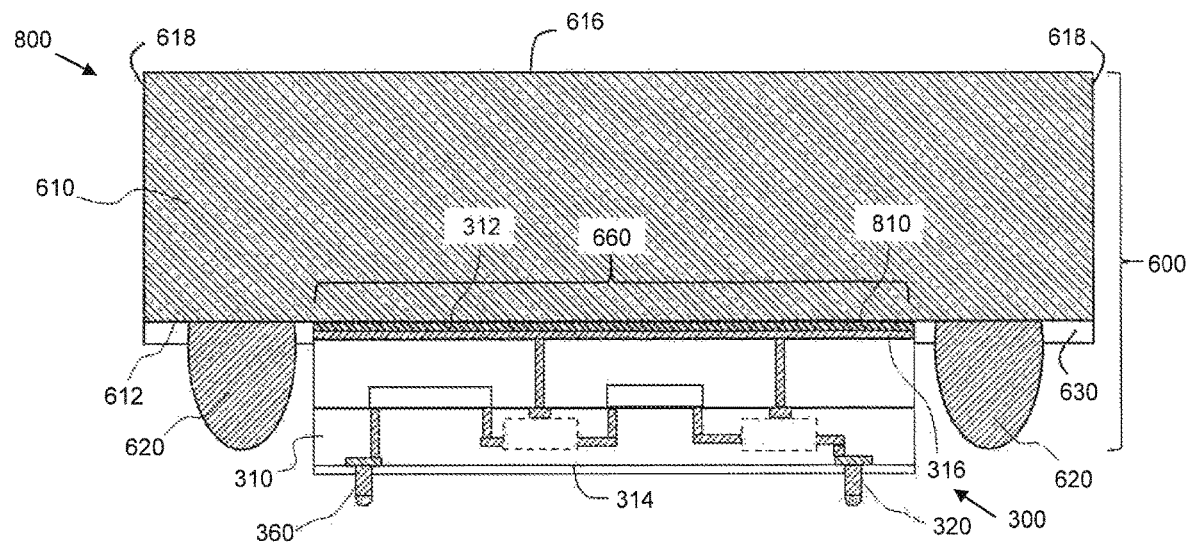
FIG. 8 is a cross-sectional, side view of a die/heat spreader assembly, in accordance with an example embodiment.

As shown in FIG. 8, the power transistor die assembly 300 and the heat spreader assembly 600 are attached together so that one or more ground contact structures 620 of the heat spreader assembly 600 are positioned on the thermal contact surface 612 between the power transistor die 310 and the perimeter (or one or more sidewalls 618) of the heat spreader assembly 600. In addition, the ground contact structures 620 and the I/O contact structures (e.g., input and output contact structures 320, 360) of the power transistor die assembly 300 are facing in a same direction (i.e., downward in the orientation of FIG. 8).

Figure 9:
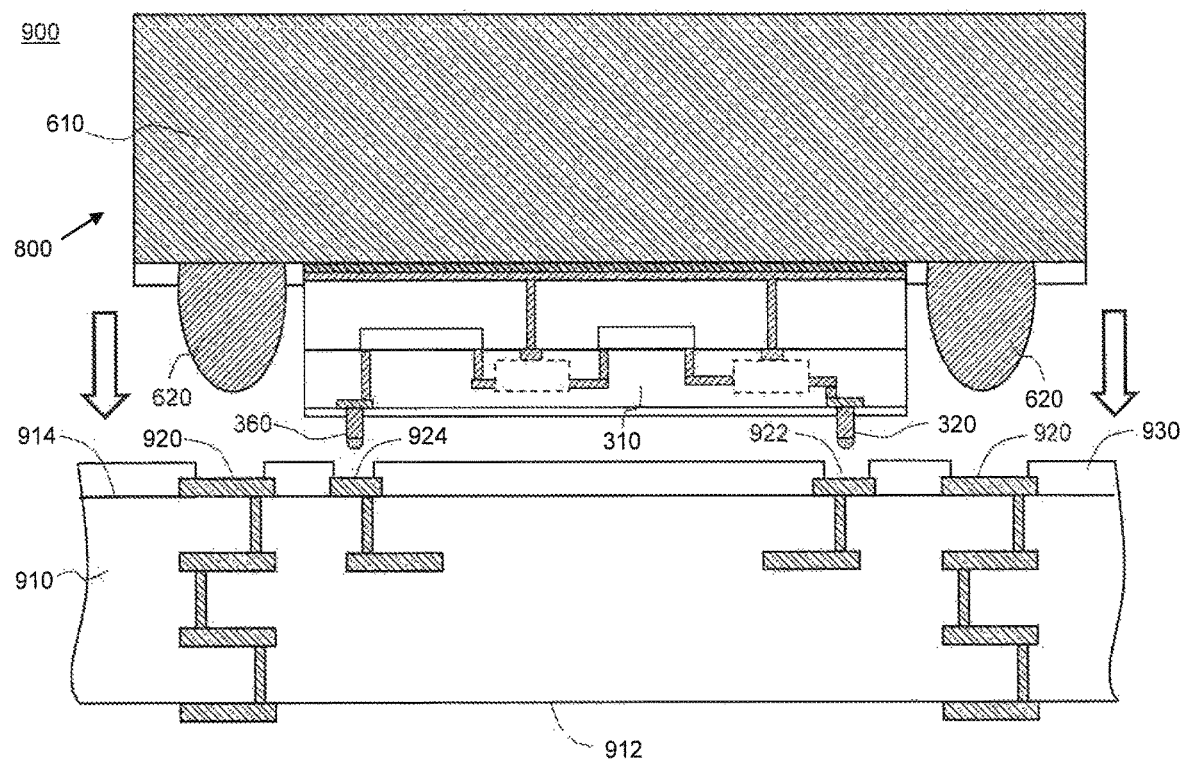
FIGS. 9 and 10 are cross-sectional, side views of a power amplifier module at two stages of fabrication, in accordance with an example embodiment.
Figure 10:
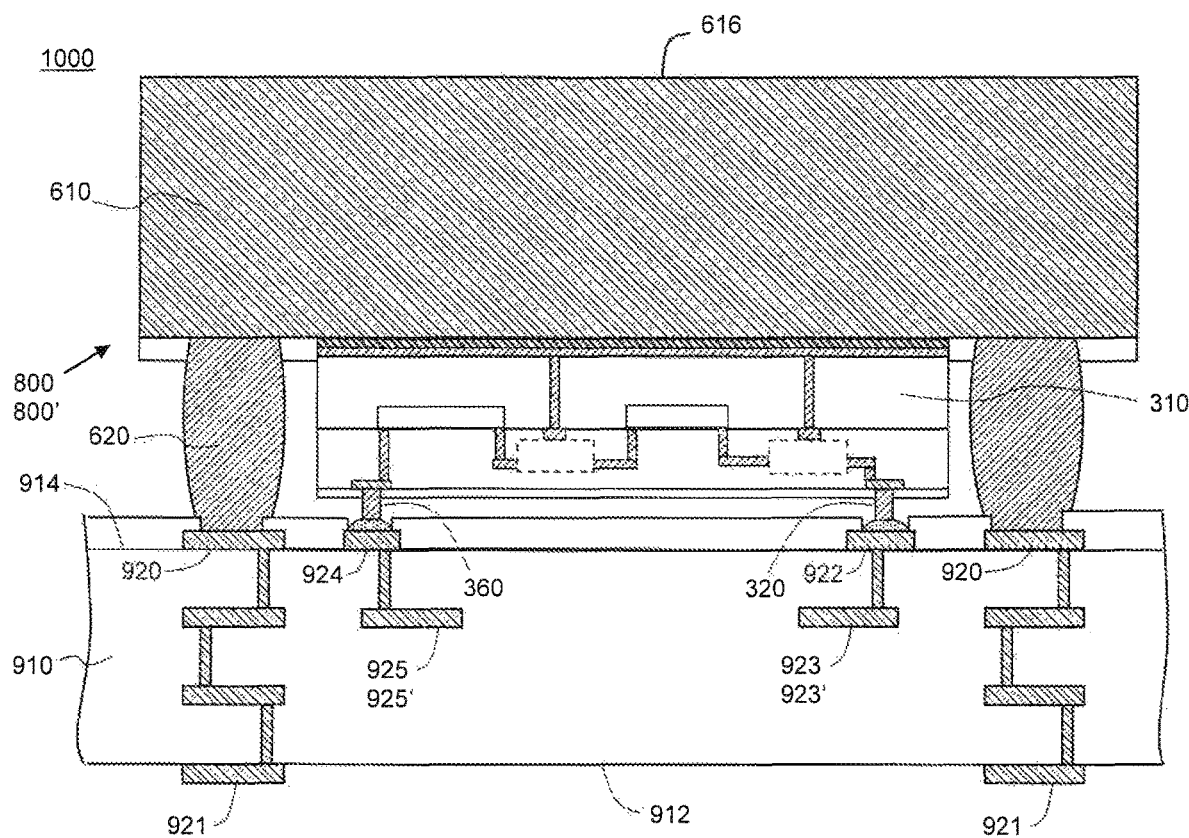

Referring again to FIG. 2, block 208 includes connecting the die/heat spreader assembly 800 to a module substrate (e.g., module substrate 910, FIGS. 1, 9). To illustrate the connection process, FIGS. 9 and 10 are cross-sectional, side views of a power amplifier module at two stages of fabrication 900, 1000, respectively, in accordance with an example embodiment. To connect these two module components, the die/heat spreader assembly 800 is aligned over a module substrate 910. As discussed previously in conjunction with FIG. 1, the module substrate 910 includes a small, multi-layer PCB with a mounting surface 914, an opposed bottom surface 912, and multiple patterned conductive layers separated by dielectric material. In the example embodiment depicted in FIG. 9, a conductive layer on the mounting surface 914 is patterned to define a plurality of conductive pads, including pads 920, 922, 924, which are exposed at the mounting surface 914 through openings in a solder mask layer 930. Pads 922, 924 correspond to RF input signal and RF output signal pads, respectively, and pads 920 correspond to ground pads. To align the die/heat spreader assembly 800 over the module substrate 910, the input contact structure 320 of the power transistor die 310 is aligned over the RF input pad 922, the output contact structure 360 of the power transistor die 310 is aligned over the RF output pad 924, and the ground contact structures 620 that are coupled to the thermal contact surface 612 of the heat spreader assembly 600 are aligned over the ground pads 920. Although not depicted in FIG. 9 or 10, other contact structures of the power transistor die 310 (e.g., contact structures 334, 337, 345, 352, FIG. 3) are aligned with corresponding pads of the module substrate 910, as well. As indicated by the vertical arrows in FIG. 9, the die/heat spreader assembly 800 and the module substrate 910 are then brought together, as shown in FIG. 10, until at least the solder balls at the ends of the I/O contact structures 320, 360 make contact with the corresponding RF input and output pads 922, 924 (e.g., solder ball 363, FIG. 4).

A solder reflow process is then performed, which includes heating the assembly to a temperature above the melting temperature of the ground contact structures 620 and the solder balls at the ends of the I/O contact structures 320, 360. Upon exceeding their melting temperatures, the ground contact structures 620 adhere to the ground pads 920, and the solder balls at the ends of the I/O contact structures 320, 360 adhere to the RF input and output pads 922, 924, respectively. The assembly is then cooled to a temperature below the melting temperature of the ground contact structures 620 and the solder balls at the ends of the I/O contact structures 320, 360, and the ground contact structures 620 and solder balls solidify to form mechanical and electrical bonds between the die/heat spreader assembly 800 and the module substrate 910, as shown in the fabrication stage 1000 in FIG. 10.

Essentially, pads 920, 922, 924 provide for electrical connectivity between the module substrate 910, the power transistor die 310, and the heat spreader 610. Each of ground pads 920 are electrically coupled through conductive vias and, in some embodiments, intermediate patterned conductive layers to additional pads 921 (e.g., conductive lands) at or on the bottom surface 912 of the module substrate 910. In addition, the RF input pad 922 is electrically coupled to an RF input trace 923, which may form a patterned portion of an interior patterned conductive layer of the module substrate 910, as shown in FIG. 10, or which may form a patterned portion of the patterned conductive layer at the mounting surface 914 of the module substrate 910. Similarly, the RF output pad 924 is electrically coupled to an RF output trace 925, which may form a patterned portion of an interior patterned conductive layer of the module substrate 910, as shown in FIG. 10, or which may form a patterned portion of the patterned conductive layer at the mounting surface 914 of the module substrate 910.

Figure 11:
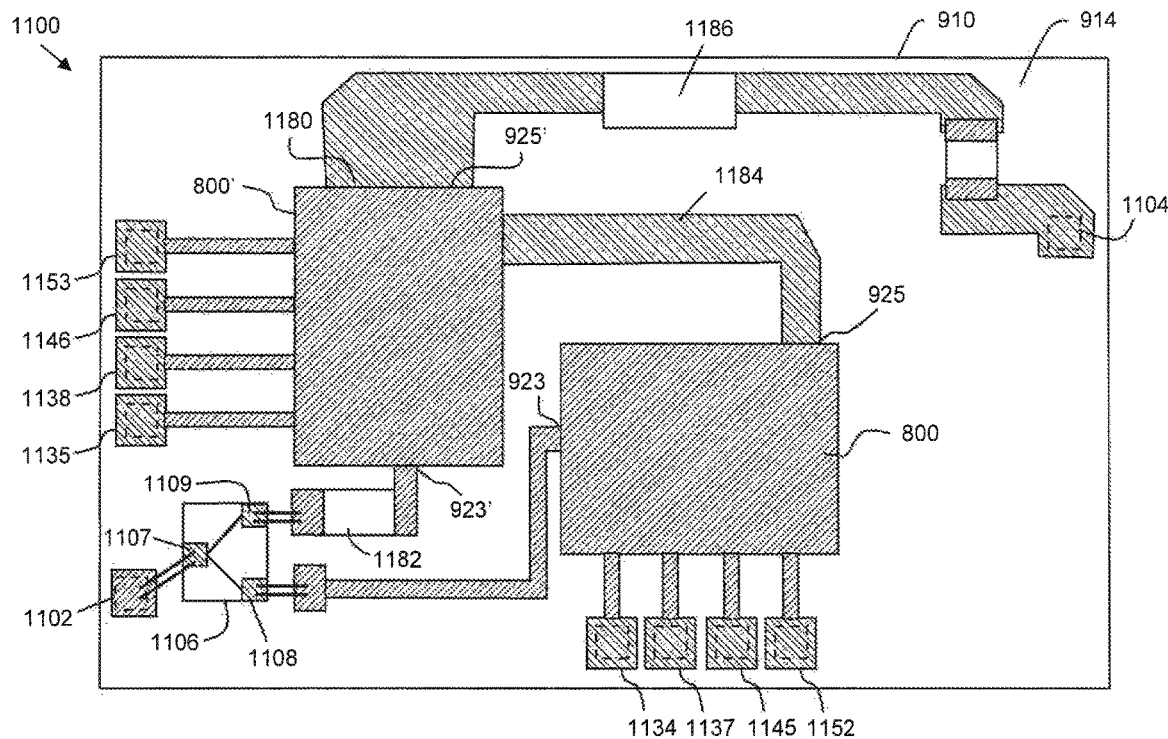
FIG. 11 is a top view of a partially-fabricated, Doherty power amplifier module that includes two die/heat spreader assemblies, in accordance with an example embodiment.

In addition to the die/heat spreader assembly 800, additional components of a power amplifier module may be coupled to the module substrate 910 to form an electrically-complete power amplifier module. For example, the power amplifier embodied by the module may include a single-path power amplifier or a multiple-path power amplifier (e.g., a push-pull amplifier, a Doherty power amplifier, and so on). For example, FIG. 11 is a top view of a partially-fabricated, Doherty power amplifier module 1100 that includes two die/heat spreader assemblies 800, 800' coupled to the mounting surface 914 of module substrate 910, in accordance with an example embodiment. In the orientation of FIG. 11, the mounting surface 914 of the module substrate 910 and the top surfaces (e.g., surface 616, FIG. 10) of each die/heat spreader assembly 800, 800' are visible.

Figure 12:
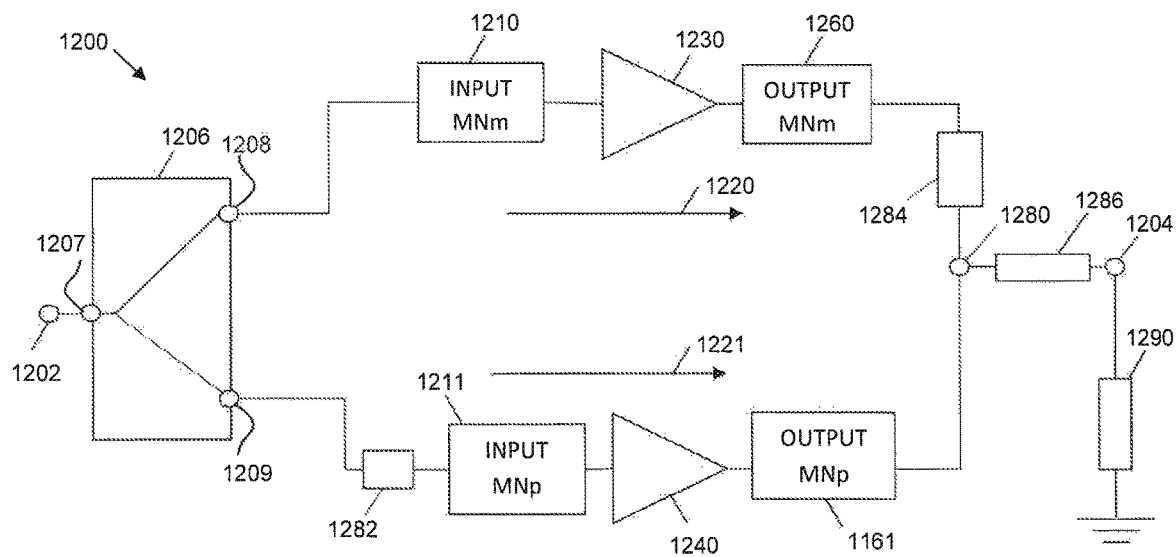
FIG. 12 is a schematic diagram of a Doherty power amplifier corresponding to the module assembly of FIG. 11, in accordance with an example embodiment.

For increased understanding, FIG. 11 should be viewed simultaneously with FIG. 12, which is a simplified schematic diagram of a Doherty power amplifier 1200 that depicts the circuit components embodied in Doherty power amplifier module 1100. Referring first to the schematic diagram in FIG. 12, Doherty amplifier 1200 includes an input node 1202, an output node 1204, a power divider 1206 (or splitter), a main amplifier path 1220 (with main amplifier 1230), a peaking amplifier path 1221 (with peaking amplifier 1240), a combining node 1280, and an impedance transformer 1286. A load 1290 (e.g., an antenna) may be coupled to the output node 1204 of the amplifier 1200 to receive an amplified RF signal produced by the amplifier 1200.

During operation of Doherty amplifier 1200, the main amplifier 1230 is biased to operate in class AB mode, and the peaking amplifier 1240 is biased to operate in class C mode. At low power levels, where the power of the input signal at node 1202 is lower than the turn-on threshold level of peaking amplifier 1240, the amplifier 1200 operates in a low-power (or backoff) mode in which the main amplifier 1230 is the only amplifier supplying current to the load 1290. When the power of the input signal exceeds a threshold level of the peaking amplifier 1240, the amplifier 1200 operates in a high-power mode in which the main amplifier 1230 and the peaking amplifier 1240 both supply current to the load 1290. At this point, the peaking amplifier 1240 provides active load modulation at combining node 1280, allowing the current of the main amplifier 1230 to continue to increase linearly.

Comparing the components of FIGS. 11 and 12, the input node 1202 corresponds to pad (or land) 1102, the output node 1204 corresponds to pad (or land) 1104, the power divider 1206 corresponds to power divider 1106, the combining node 1280 corresponds to point 1180, the main amplifier path 1220 includes the first die/heat spreader assembly 800 and other circuit components between the power divider 1106 and point 1180, the peaking amplifier path 1221 includes the second die/heat spreader assembly 800' and other circuit components between the power divider 1106 and point 1180, and the impedance transformer 1286 includes circuit components indicated abstractly by box 1186. According to an embodiment, each of the input and output pads 1102, 1104 are exposed at the bottom surface (e.g., surface 912, FIG. 10), which ultimately enables the module 1100 to be surface-mounted to a system substrate (e.g., system substrate 120, FIG. 1), as will be discussed later. The load 1290, which is not depicted in FIG. 11, would be coupled to output pad 1104.

Power divider 1106, 1206 has a power divider input 1107, 1207, a first power divider output 1108, 1208, and a second power divider output 1109, 1209. For example, power divider 1106 may be a surface mount component that is electrically and mechanically coupled to the mounting surface 914 of module substrate 910. Alternatively, power divider 1106 may be implemented with various discrete components and/or conductors that are coupled to the mounting surface 914. Either way, power divider 1106, 1206 receives an input RF signal through power divider input 1107, 1207. During operation in a backoff mode when only the main amplifier path 1220 is supplying current to the load 1290, power divider 1106, 1206 is configured to supply the full input RF signal to the main amplifier path 1220, and does not supply significant signal power to the peaking amplifier path 1221. During operation in a full-power mode when both the main and peaking amplifier paths 1220, 1221 are supplying current to the load 1290, power divider 1106, 1206 is configured to divide the input RF signal into main and peaking portions of the input signal. The main input signal is provided to the main amplifier path 1220 at power divider output 1108, 1208, and the peaking input signal is provided to the peaking amplifier path 1221 at power divider output 1109, 1209. For example, the power divider 1106, 1206 may divide the power equally, such that roughly one half of the input signal power is provided to each path 1220, 1221 (e.g., for a symmetric Doherty amplifier configuration). Alternatively, the power divider 1106, 1206 may divide the power unequally (e.g., for an asymmetric Doherty amplifier configuration).

The divided signals produced by power divider 1106, 1206 are separately amplified along the main and peaking amplifier paths 1220, 1221. The main amplification path 1220 includes an input matching network (MNm) 1210, a main amplifier 1230, an output matching network (MNm) 1260, and a phase delay and impedance inverter circuit 1284, all of which is electrically coupled in series between the first power divider output 1108, 1208 and the combining node 1180, 1280. The main amplifier 1230 is implemented in the first die/heat spreader assembly 800 (FIG. 11). Referring also to FIG. 10, for example, the power transistor die 310 of the first die/heat spreader assembly 800 essentially corresponds to the main amplifier 1230, where the main amplifier input signal is received through trace 923 and pad 922, and the main amplifier amplified output signal is produced at pad 924 and trace 925. The main amplifier input MNm 1210 and output MNm 1260 each may be implemented within the power transistor die 310 of assembly 800, and/or using components (not illustrated) coupled to the module substrate 910. Finally, the phase delay and impedance inverter circuit 1284 may be implemented, at least in part, by a conductive trace 1184 on or within the module substrate 910, which has a first end coupled to the output pad 924 of assembly 800, and a second end coupled to the combining node 1180, 1280. The main amplification path 1220 also may include additional circuitry (not illustrated), such as harmonic termination and/or baseband termination circuits, in some embodiments.

The peaking amplification path 1221 includes a phase delay circuit 1282, an input matching network (MNp) 1211, a peaking amplifier 1240, and an output matching network (MNp) 1261, all of which is electrically coupled in series between the second power divider output 1109, 1209 and the combining node 1180, 1280. The peaking amplifier 1240 is implemented in the second die/heat spreader assembly 800' (FIG. 11). Referring again to FIG. 10, the power transistor die 310 of the second die/heat spreader assembly 800' essentially corresponds to the peaking amplifier 1240, where the peaking amplifier input signal is received through trace 923 (identified as 923' in FIG. 11) and pad 922, and the main amplifier amplified output signal is produced at pad 924 and trace 925. The main amplifier input MNm 1210 and output MNm 1260 each may be implemented within the power transistor die 310 of assembly 800, and/or using components (not illustrated) coupled to the module substrate 910. Finally, the phase delay and impedance inverter circuit 1284 may be implemented, at least in part, by a conductive trace 1184 on or within the module substrate 910, which has a first end coupled to the output pad 924 of assembly 800, and a second end coupled to the combining node 1180, 1280. The peaking amplification path 1221 also may include additional circuitry (not illustrated), such as harmonic termination and/or baseband termination circuits, in some embodiments.

For proper Doherty amplifier operation, the signals amplified along the main and peaking amplifier paths 1220, 1221 are 90 degrees out of phase with each other when each signal is amplified by the main or peaking amplifiers 1230, 1240. FIG. 12 illustrates a "non-inverted" Doherty amplifier, in which a phase delay circuit or element 1182, 1282 applies a 90 degree phase delay (at the center frequency of operation, f0, of the amplifier) to the input signal to the peaking path 1221 prior to amplification by the peaking amplifier 1240. To ensure that the amplified signals are combined in phase at the combining node 1180, 1280, a phase delay and impedance inverter circuit 1184, 1284 along the main path 1220 applies a 90 degree phase delay to the amplified output signal from the main amplifier 1230. In an alternate embodiment, the Doherty amplifier may be configured as an "inverted" Doherty amplifier, in which the input-side 90 degree phase delay circuit or element 1182, 1282 is implemented at the input to the main amplifier 1230, rather than at the input to the peaking amplifier 1240, and the output-side phase delay and impedance inverter circuit 1184, 1284 is implemented between the output of the peaking amplifier 1240 and the combining node 1280, rather than between the output of the main amplifier 1230 and the combining node 1280.

As mentioned above, during operation of Doherty amplifier 1200, the main amplifier 1230 is biased to operate in class AB mode, and the peaking amplifier 1240 is biased to operate in class C mode. In the physical implementation of FIG. 11, this is accomplished by providing appropriate bias voltages to the power transistors within each of the amplifier die 310 (FIG. 10) of the die/heat spreader assemblies 800, 800'. For example, referring again to FIG. 3, gate bias voltages may be provided to the gate terminals 332, 343 of transistors 330, 340 through gate bias voltage pads 333, 344 and contact structures 334, 345, respectively. Similarly, drain bias voltages may be provided to the drain terminals 335, 354 of transistors 330, 340 through drain bias voltage pads 336, 351 and contact structures 337, 352, respectively. Referring again to FIG. 11, to provide appropriate bias voltages to the main amplifier implemented in die/heat spreader assembly 800, the module substrate 910 may include main amplifier bias voltage pads 1134, 1137, 1145, 1152 (e.g., exposed at the bottom surface of the module substrate 910) and various conductive structures to convey gate and drain bias voltages to the bias voltage contact structures (e.g., contact structures 334, 337, 345, 352, FIG. 3). Similarly, to provide appropriate bias voltages to the peaking amplifier implemented in die/heat spreader assembly 800', the module substrate 910 may include peaking amplifier bias voltage pads 1135, 1138, 1146, 1153 (e.g., exposed at the bottom surface of the module substrate 910) and various conductive structures to convey gate and drain bias voltages to the bias voltage contact structures (e.g., contact structures 334, 337, 345, 352, FIG. 3).

Those of skill in the art would understand that the amplifier embodiments described herein may be used in other amplifier topologies besides Doherty amplifier topologies. Although such alternatives are not discussed in detail herein, embodiments that include such modifications are intended to fall within the scope of the inventive subject matter.

Figure 13:
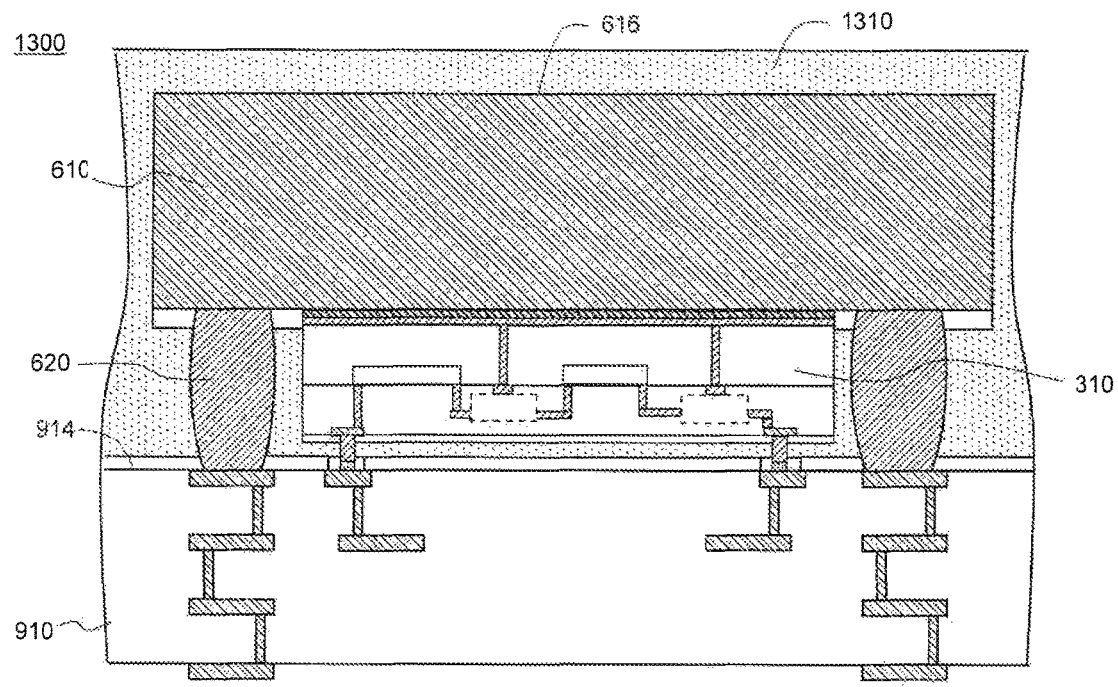
FIGS. 13 and 14 are additional, cross-sectional, side views of a power amplifier module at two additional stages of fabrication, in accordance with an example embodiment.
Figure 14:
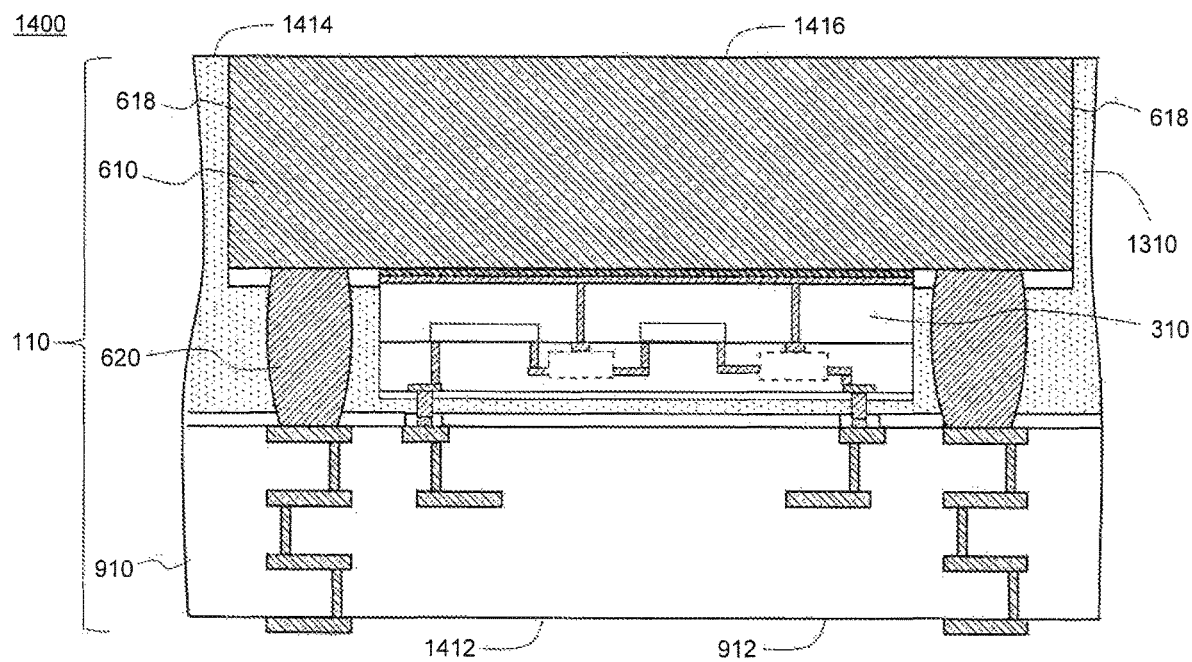

According to an embodiment, fabrication of the power amplifier module (e.g., module 1100, FIG. 11) may then be completed, as shown in FIGS. 13 and 14, which are cross-sectional, side views of the power amplifier module of FIG. 10 at two later stages of fabrication 1300, 1400. Referring again to FIG. 2, in block 210, the die/heat spreader assembly (or assemblies) (e.g., assemblies 800, 800', FIGS. 10, 11) coupled to the mounting surface 914 of the module substrate 910 are encapsulated with a non-conductive encapsulant material 1310 (e.g., a plastic encapsulant), as shown in FIG. 13. The encapsulant material 1310 encapsulates the entire die/heat spreader assembly (including the surface 616 of the heat spreader 610), and at least a portion of the mounting surface 914 of the module substrate 910. In block 212, and as shown in FIG. 14, a portion of the encapsulant material 1310 is removed to produce an outer thermal contact surface 1416 of each heat spreader 610. In some embodiments, the outer thermal contact surface 1416 may be the same as the original heat spreader surface 616 (FIG. 10). In other embodiments, a portion of the heat spreader 610 may be removed during the encapsulant removal process (e.g., using mechanical or chemical removal processes) to produce the outer thermal contact surface 1416. Ultimately, the encapsulant material 1310 covers at least a portion of the mounting surface 914 of the module substrate 910, the power transistor die 310, and sidewalls 618 of the heat spreader 610. At this stage, the outer thermal contact surface 1416 is co-planar with the heat dissipation surface 1414 of the power amplifier module, and the contact surface 912 of the module substrate 910 corresponds to the contact surface 1412 of the power amplifier module. Thus, power amplifier module 110 is completed.

In block 214, and referring once again to FIG. 1, the RF system 100 is completed by electrically and mechanically coupling the power amplifier module 110 to the system substrate 120, and by thermally and mechanically coupling the heat dissipation structure 130 to the power amplifier module 110. To couple the power amplifier module 110 to the system substrate 120, the module pads (e.g., pads 921) exposed at the contact surface 1412 of the power amplifier module 110 are aligned with corresponding system substrate pads (e.g., pads 126) exposed at the mounting surface 124 of the system substrate 120. The power amplifier module 110 and the system substrate 120 are brought together, and the module and substrate pads (e.g., pads 921, 126) are electrically and mechanically connected with a conductive solder or epoxy 128. Although not depicted in FIG. 1, similar connections would be made between RF I/O pads (e.g., pads 1102, 1104, FIG. 11) and bias pads (e.g., pads 1134, 1135, 1137, 1138, 1145, 1146, 1152, 1153, FIG. 11) of the power amplifier module 110 and corresponding RF I/O and bias pads at the mounting surface 124 of the system substrate 120.

To couple the heat dissipation structure 130 to the power amplifier module 110, a thermally conductive material 132 (e.g., thermal grease) may be dispensed on the outer thermal contact surface 1416 of the heat spreader 610 (and/or on the surface of the heat dissipation structure 130), and the heat dissipation structure 130 may be brought into contact with the heat spreader 610 and the heat dissipation surface 1414. The heat dissipation structure 130 may then be clamped, screwed, or otherwise secured in place. Formation of the RF system 100 is then complete.

Once again, during operation of RF system 100, significant thermal energy (heat) may be produced by the power transistor(s) within the power transistor die 310. As indicated by arrows 150, the thermal energy produced by the power transistor(s) is conveyed through the heat spreader 610 to the heat dissipation structure 130, which effectively dissipates the heat to the ambient atmosphere. In addition, as indicated by arrows 140 a conductive layer 316 on the ground surface 312 of the power transistor die 310 is electrically connected to system ground through the heat spreader 610, ground contact structures 620, module substrate pads 920, 921 and through-substrate conductors, system substrate pads 126, and further conductive structures of the system substrate 120 (which ultimately are electrically connected to system ground, as shown in FIG. 1). Accordingly, the heat spreader 610 provides two functions: 1) the function of conveying heat produced by the power transistor die 310 to the heat dissipation structure 130; and 2) the function of electrically coupling the integrated power transistor(s) within the power transistor die 310 to system ground.

An embodiment of a power amplifier module includes a module substrate, a first power transistor die, a first heat spreader, and an electrical ground contact structure. The module substrate has a mounting surface, a first module pad exposed at the mounting surface, a second module pad exposed at the mounting surface, and a third module pad exposed at the mounting surface. The first power transistor die has an input/output (I/O) surface, a ground surface opposite the I/O surface, an input pad exposed at the I/O surface, an output pad exposed at the I/O surface, and an integrated power transistor with a control terminal electrically coupled to the input pad, a first current-carrying terminal electrically coupled to the output pad, and a second current-carrying terminal electrically coupled to the ground surface. The first power transistor die is coupled to the module substrate with the I/O surface facing the mounting surface, the input pad electrically coupled to the first module pad, and the output pad electrically coupled to the second module pad. The first heat spreader has a first thermal contact surface that is physically and electrically coupled to the ground surface of the first power transistor die, and the first thermal contact surface has a peripheral area that extends beyond the ground surface of the first power transistor die. The electrical ground contact structure is connected between the peripheral area of the first thermal contact surface and the third module pad of the module substrate.

According to a further embodiment, the power amplifier module also includes an input signal contact electrically coupled to the first module pad, an output signal contact electrically coupled to the second module pad, and a system ground contact electrically coupled to the third module pad. According to another further embodiment, the power amplifier module also includes an input contact structure connected between the input pad of the first power transistor die and the first module pad, and an output contact structure connected between the output pad of the first power transistor die and the second module pad. According to yet another further embodiment, the input contact structure and the output contact structure each include one or more components selected from a conductive pillar and solder. According to yet another further embodiment, the electrical ground contact structure includes one or more components selected from a conductive pillar and solder. According to yet another further embodiment, the first heat spreader includes a thermally- and electrically-conductive material selected from copper or another bulk conductive material. According to yet another further embodiment, the integrated power transistor is a field effect transistor, the control terminal is a gate terminal of the field effect transistor, the first current-carrying terminal is a drain terminal of the field effect transistor, and the second current-carrying terminal is a source terminal of the field effect transistor. According to yet another further embodiment, the first power transistor die includes a semiconductor substrate and a build-up structure. The semiconductor substrate has a first surface and a second surface opposite the first surface, where the second surface of the semiconductor substrate corresponds to the ground surface of the first power transistor die. The build-up structure is formed on the first surface of the semiconductor substrate, and an exposed surface of the build-up structure corresponds to the I/O surface of the first power transistor die. According to yet another further embodiment, the first power transistor die further includes a conductive layer on the second surface of the semiconductor substrate, and a plurality of through substrate vias, where each of the through substrate vias extend from the first surface of the semiconductor substrate to the second surface of the semiconductor substrate, and where the second current-carrying terminal of the integrated power transistor is electrically coupled to the conductive layer through the plurality of through substrate vias.

According to yet another further embodiment, the power amplifier module further includes encapsulant material covering the mounting surface of the module substrate, the first power transistor die, and sidewalls of the first heat spreader. According to yet another further embodiment, the first heat spreader further includes a second thermal contact surface opposite the first thermal contact surface, and a surface of the encapsulant material is co-planar with the second thermal contact surface.

According to yet another further embodiment, the power amplifier module further includes a heat dissipation structure coupled to the second thermal contact surface.

According to yet another further embodiment, the power amplifier module further includes a second power transistor die coupled to the mounting surface, and a second heat spreader that is physically and electrically coupled to the second power transistor die, where the first power transistor die corresponds to a main amplifier of a Doherty power amplifier, and the second power transistor die corresponds to a peaking amplifier of the Doherty power amplifier.

An embodiment of a method of fabricating a power amplifier module includes coupling a ground surface of a power transistor die to a first portion of a first thermal contact surface of a heat spreader, where the power transistor die has an input/output (I/O) surface, the ground surface opposite the I/O surface, an input pad exposed at the I/O surface, an output pad exposed at the I/O surface, and an integrated power transistor with a control terminal electrically coupled to the input pad, a first current-carrying terminal electrically coupled to the output pad, and a second current-carrying terminal electrically coupled to the ground surface. The method further includes connecting the power transistor die to a mounting surface of a module substrate that includes first, second, and third module pads exposed at the mounting surface, where the power transistor die is connected to the mounting surface of the module substrate so that the input pad is connected to the first module pad, and the output pad is connected to the second module pad. The method further includes connecting an electrical ground contact structure between a peripheral area of the first thermal contact surface of the heat spreader and the third module pad.

According to a further embodiment, the method of fabricating a power amplifier module also includes electrically connecting the third module pad to a ground reference.

According to another further embodiment, the method also includes encapsulating the heat spreader, the power transistor die, and the module substrate to form a power amplifier module.

According to yet another further embodiment, connecting the power transistor die to the mounting surface of the module substrate includes coupling a first contact structure to the input pad, coupling a second contact structure to the output pad, aligning the first and second contact structures with the first and second module pads, and reflowing solder to connect the first contact structure to the first module pad, and to connect the second contact structure to the second module pad. According to yet another further embodiment, each of the first and second contact structures includes a rigid conductive pillar. According to yet another further embodiment, the electrical ground contact structure includes solder. According to yet another further embodiment, the electrical ground contact structure includes a rigid conductive pillar.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier module comprising:
a module substrate with a mounting surface, a first module pad exposed at the mounting surface, a second module pad exposed at the mounting surface, and a third module pad exposed at the mounting surface;
a first power transistor die with an input/output (I/O) surface, a ground surface opposite the I/O surface, an input pad exposed at the I/O surface, an output pad exposed at the I/O surface, and an integrated power transistor with a control terminal electrically coupled to the input pad, a first current-carrying terminal electrically coupled to the output pad, and a second current-carrying terminal electrically coupled to the ground surface, wherein the first power transistor die is coupled to the module substrate with the I/O surface facing the mounting surface, the input pad electrically coupled to the first module pad, and the output pad electrically coupled to the second module pad;
a first heat spreader with a first thermal contact surface, a second thermal contact surface, and sidewalls extending between the first and second thermal contact surfaces, wherein the first thermal contact surface includes an interior area and a peripheral area that extends parallel to the interior area between the interior area and a first sidewall of the sidewalls;
a patterned mask layer on the first thermal contact surface that includes an interior opening that exposes the interior area of the first thermal contact surface, and a peripheral opening that exposes the peripheral area of the first thermal contact surface, wherein the interior area is physically and electrically coupled through the interior opening to the ground surface of the first power transistor die; and
an electrical ground contact structure connected through the peripheral opening to the peripheral area of the first thermal contact surface, and also connected to the third module pad of the module substrate.

2. The power amplifier module of claim 1, wherein the module substrate further comprises:
an input signal contact electrically coupled to the first module pad;
an output signal contact electrically coupled to the second module pad; and
a system ground contact electrically coupled to the third module pad.

3. The power amplifier module of claim 1, further comprising:
an input contact structure connected between the input pad of the first power transistor die and the first module pad; and
an output contact structure connected between the output pad of the first power transistor die and the second module pad.

4. The power amplifier module of claim 3, wherein the input contact structure and the output contact structure each include one or more components selected from a conductive pillar and solder.

5. The power amplifier module of claim 1, wherein the electrical ground contact structure comprises one or more components selected from a conductive pillar and solder.

6. The power amplifier module of claim 1, wherein the first heat spreader comprises a thermally- and electrically-conductive material selected from copper or another bulk conductive material.

7. The power amplifier module of claim 1, wherein the integrated power transistor is a field effect transistor, the control terminal is a gate terminal of the field effect transistor, the first current-carrying terminal is a drain terminal of the field effect transistor, and the second current-carrying terminal is a source terminal of the field effect transistor.

8. The power amplifier module of claim 1, wherein the first power transistor die comprises:
a semiconductor substrate with a first surface and a second surface opposite the first surface, wherein the second surface of the semiconductor substrate corresponds to the ground surface of the first power transistor die; and
a build-up structure formed on the first surface of the semiconductor substrate, wherein an exposed surface of the build-up structure corresponds to the I/O surface of the first power transistor die.

9. The power amplifier module of claim 8, wherein the first power transistor die further comprises:
a conductive layer on the second surface of the semiconductor substrate; and
a plurality of through substrate vias, wherein each of the through substrate vias extend from the first surface of the semiconductor substrate to the second surface of the semiconductor substrate, and wherein the second current-carrying terminal of the integrated power transistor is electrically coupled to the conductive layer through the plurality of through substrate vias.

10. The power amplifier module of claim 1, further comprising:
encapsulant material covering the mounting surface of the module substrate, the first power transistor die, and sidewalls of the first heat spreader.

11. The power amplifier module of claim 10, wherein:
a surface of the encapsulant material is co-planar with the second thermal contact surface.

12. The power amplifier module of claim 11, further comprising:
a heat dissipation structure coupled to the second thermal contact surface.

13. The power amplifier module of claim 1, further comprising:
a second power transistor die coupled to the mounting surface; and
a second heat spreader that is physically and electrically coupled to the second power transistor die, wherein the first power transistor die corresponds to a main amplifier of a Doherty power amplifier, and the second power transistor die corresponds to a peaking amplifier of the Doherty power amplifier.

* * * * *